United States Patent
Mathews et al.

(10) Patent No.: US 7,188,661 B2
(45) Date of Patent: Mar. 13, 2007

(54) PROCESS FOR JOINING MEMBERS OF A HEAT TRANSFER ASSEMBLY AND ASSEMBLY FORMED THEREBY

(75) Inventors: Donald W. Mathews, Georgiana, AL (US); John D. Lamberth, Montgomery, AL (US)

(73) Assignee: ThermaMasters, LLC, Wetumpka, AL (US)

( * ) Notice: Subject to any disclaimer, the term of this patent is extended or adjusted under 35 U.S.C. 154(b) by 79 days.

(21) Appl. No.: 10/904,497

(22) Filed: Nov. 12, 2004

(65) Prior Publication Data

US 2005/0103470 A1    May 19, 2005

Related U.S. Application Data

(60) Provisional application No. 60/481,633, filed on Nov. 13, 2003.

(51) Int. Cl.
*H05K 7/20* (2006.01)
(52) U.S. Cl. .................. 165/80.3; 361/704; 29/890.03
(58) Field of Classification Search ............... 165/80.3, 165/185; 361/704
See application file for complete search history.

(56) References Cited

U.S. PATENT DOCUMENTS

| | | | |
|---|---|---|---|
| 4,023,246 A * | 5/1977 | Haug et al. | 407/56 |
| 5,177,910 A * | 1/1993 | Norota et al. | 451/529 |
| 5,950,721 A * | 9/1999 | Bock et al. | 165/185 |
| 6,234,246 B1 * | 5/2001 | Bock et al. | 165/185 |
| 6,520,248 B2 * | 2/2003 | Gailus et al. | 165/80.3 |
| 2003/0180091 A1 * | 9/2003 | Stridsman | 404/41 |
| 2004/0108102 A1 * | 6/2004 | Otsuki et al. | 165/121 |
| 2005/0012202 A1 * | 1/2005 | Bock et al. | 257/706 |

FOREIGN PATENT DOCUMENTS

| | | |
|---|---|---|
| EP | 759636 A2 * | 2/1997 |
| EP | 795905 A2 * | 9/1997 |

* cited by examiner

*Primary Examiner*—Allen J. Flanigan
(74) *Attorney, Agent, or Firm*—Gary M. Hartman; Domenica N. S. Hartman; Hartman & Hartman, P.C.

(57) ABSTRACT

A method and assembly that makes use of an adhesive to form a joint structure between two members, such as two heat transfer components. A first member has a slot in a surface thereof, while the second member has an edge received in the slot of the first member. One or both of the first and second members has one or more features that force the edge of the second member away from the first surface of the slot and into contact with the second surface of the slot during insertion of the edge into the slot. An adhesive within the slot bonds the second member to the first member.

20 Claims, 1 Drawing Sheet

PROCESS FOR JOINING MEMBERS OF A HEAT TRANSFER ASSEMBLY AND ASSEMBLY FORMED THEREBY

CROSS REFERENCE TO RELATED APPLICATIONS

This application claims the benefit of U.S. Provisional Application No. 60/481,633, filed Nov. 13, 2003.

BACKGROUND OF THE INVENTION

The present invention generally relates to joints formed between members of a heat transfer device, such as a heat sink, heat exchanger, chill plate, etc. More particularly, this invention relates to an assembly process that makes use of an adhesive to form a joint structure between heat transfer components, wherein the joint structure is configured to promote heat transfer therethrough.

In the heat transfer industry, polymer-based adhesives have been used to form simple adhesive joints to attach components of a heat transfer product, such as a heat sink, heat exchanger, chill plate, etc. Joints formed by brazing, soldering, and welding are capable of much better heat transfer efficiency as a result of the higher thermal conductivities of braze, solder and weld materials and the metallurgical bonds formed by these materials. However, an advantage of adhesive joints is that they can be produced at a lower cost than brazed, soldered or welded joints.

There is a need for improved methods of joining components of heat transfer products, especially methods that could offer the cost advantage of adhesive techniques along with the performance advantage of metallurgical bonding techniques.

BRIEF SUMMARY OF THE INVENTION

The present invention provides a method and assembly that makes use of an adhesive to form a joint structure between two members, such as two heat transfer components, such that the resulting joint structure is configured to promote heat transfer therethrough.

According to a first aspect of the invention, a heat transfer assembly is provided having at least first and second members. The first member has a slot in a surface thereof, and the slot has opposing surfaces. The second member has an edge received in the slot of the first member. The first and second members, together or individually, have one or more features that force the edge of the second member away from a first of the opposing surfaces of the slot and into contact with a second of the opposing surfaces of the slot during insertion of the edge into the slot. Finally, an adhesive within the slot bonds the second member to the first member.

According to a second aspect of the invention, a heat transfer assembly method is provided that entails forming a first member to have in a surface thereof a slot with opposing surfaces, forming a second member to have an edge, dispensing an adhesive in the slot of the first member, and inserting the edge of the second member into the slot of the first member, wherein insertion of the edge into the slot causes the edge to be forced away from a first of the opposing surfaces of the slot and into contact with a second of the opposing surfaces of the slot.

In view of the above, it can be seen that a significant advantage of this invention is that the resulting joint structures formed by the first and second members offer the cost advantage of bonding with an adhesive, while also having the performance advantage associated with metallurgical bonding techniques as a result of the surface-to-surface contact between the edge of the second member and the second surface of the first member.

Other objects and advantages of this invention will be better appreciated from the following detailed description.

DETAILED DESCRIPTION OF THE INVENTION

Figure 1:
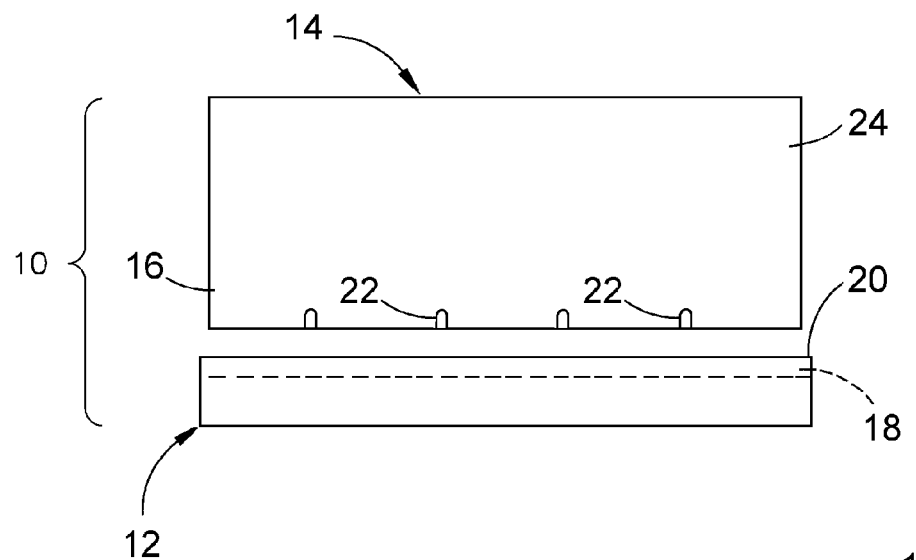
FIGS. 1 and 2 are frontal and side views, respectively, of a heat transfer assembly comprising a body and fins in accordance with an embodiment of this invention.
Figure 2:
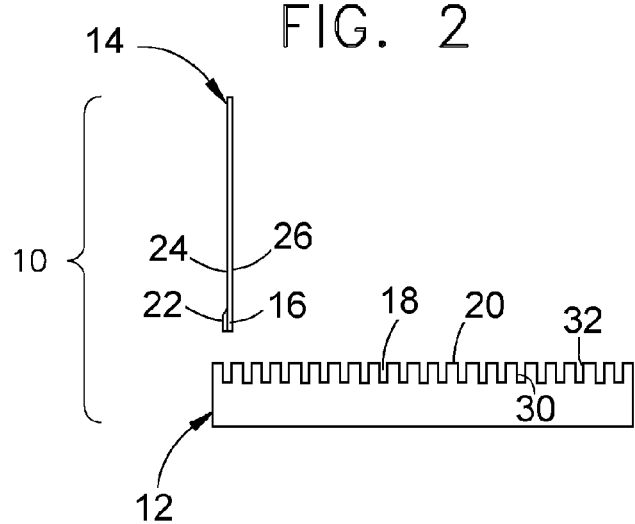
Figure 3:
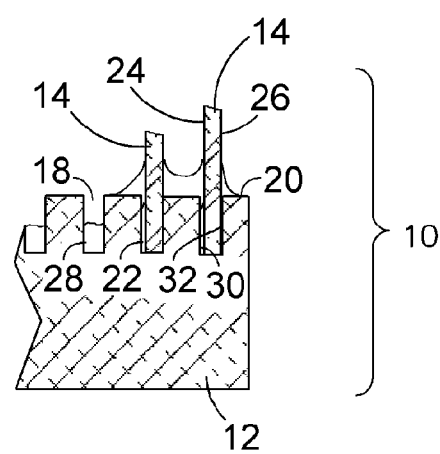
FIG. 3 is a cross-sectional view showing two fins installed in slots formed in the body of FIG. 1

FIGS. 1 through 3 depict a heat transfer assembly 10 comprising a body 12 to which fins 14 are attached for dissipating heat from the body 12. The assembly 10, body, and fins 14 are all schematically represented in the Figures, and therefore a variety of heat transfer assemblies that may comprise essentially any type of body and fins are also within the scope of the invention. Particular applications for which this invention is believed to be particularly well suited include heat transfer devices for cooling electrical/electronic components, motors, generators, heat exchangers that exchange heat between liquids and/or gases, etc. For example, the body 12 could be a portion of a circuit package, heat transfer tube, motor, generator, etc., from which heat is dissipated with the fins 14. Suitable materials for the body 12 and fins 14 will depend on the particular requirements of the given application. According to common practice in the above-noted applications, aluminum, copper, and their alloys will often be suitable materials for the body 12 and fins 14.

Each fin 14 is configured so that one of its edges 16 can be individually received in one of multiple grooves or slots 18 formed in a surface 20 of the body 12. The slots 18 are depicted in FIG. 2 as having generally rectangular cross-sections of roughly identical size, though other cross-sectional shapes and sizes are foreseeable. Furthermore, the slots 18 are depicted as being arranged in parallel on the surface 20 of the body 12, causing the fins 14 to also be arranged in parallel, though such an arrangement is not required. The edge 16 of each fin 14 has multiple mechanical enhancements, generally protuberances represented as bumps 22 in the Figures, on one surface 24 of the fin 14. The bumps 22 (or other protuberances) can be formed along the edges 16 of the fins 14 by any suitable method, such as by stamping the fins 14.

The bumps 22 are preferably sized so that the composite thickness of the edge 16 (the distance between the outer surface of a bump 22 and the opposite surface 26 of the fin 14) is the same or slightly larger than the width of the slot 18 in which the edge 16 will be inserted. As such, the bumps 22 formed on the edge 16 of a fin 14 enhance the contact of the fin 14 with the body 12 by forcing the fin edge 16 away from the wall 30 of the slot 18 contacted by the bumps 22, and forcing the surface 26 of the edge 16 into face-to-face contact with the opposite wall 32 of the slot 18. To promote uniform contact between each paired fin edge 16 and slot wall 32, the bumps 22 preferably uniformly spaced along the fin edge 16 as depicted in FIG. 1.

Each slot 18 in the body 12 is sized to accommodate an amount of adhesive 28 prior to assembly with its respective fin 14. The adhesive 28 may be any suitable type used in the art, such as an epoxy. The forced assembly of an edge 16 of a fin 14 into one of the slots 18 in the body 12 displaces the adhesive 28 away from the wall 32 forced into contact with the fin 14 by the bumps 22, creating a substantially direct (surface-to-surface) contact between the wall 32 and the surface 26 of the fin 14 opposite the bumps 22. This direct contact greatly enhances heat transfer between the body 12 and its fins 14 as compared to prior art adhesive joints, but at much less cost than would be incurred if the fins 14 were brazed, soldered or welded to the body 12. The adhesive 28 within each slot 18 is predominantly contained within a gap defined by and between the surface 24 of the fin 14 and the wall 30 of the slot 18, and after curing forms an adhesive bond between the body 12 and fin 14.

While the invention has been described in terms of a preferred embodiment, it is apparent that other forms could be adopted by one skilled in the art. For example, means other than bumps could be used to force substantial face-to-face contact between the fin edges 16 and the walls 32 of the slots 18, and the bumps 22 or other mechanical enhancements could be formed on the opposite wall 30 of each slot 16 instead of on the edges 16 of the fins 14. Therefore, the scope of the invention is to be limited only by the following claims.

What is claimed is:

1. A heat transfer assembly comprising:
    a first member having a slot in a surface thereof, the slot having opposing first and second surfaces;
    a second member having an edge portion thereof received in the slot of the first member, the edge portion having opposing first and second surfaces facing the first and second surfaces, respectively, of the slot;
    means for offsetting the edge portion within the slot by forcing the first surface of the edge portion away from the first surface of the slot and forcing the second surface of the edge portion into substantially surface-to-surface contact with the second surface of the slot during insertion of the edge portion into the slot, the offsetting means causes a gap to be defined between the first surfaces of the edge portion and the slot; and
    an adhesive in the gap between the first surfaces of the edge portion and the slot, the adhesive bonding the first surface of the edge portion to the first surface of the slot so as to bond the second member to the first members, wherein by forcing the second surface of the edge portion into substantially surface-to-surface contact with the second surface of the slot, the offsetting means displaces the adhesive from between the second surfaces of the edge portion and the slot during insertion of the edge portion into the slot.

2. The heat transfer assembly according to claim 1, wherein the offsetting means comprises at least one protrusion on the edge portion of the second member and protruding from the first surface thereof.

3. The heat transfer assembly according to claim 2, wherein the edge portion has a composite thickness defined by a distance between the second surface of the edge portion and an outermost extent of the at least one protrusion from the first surface of the edge portion, and the composite thickness is the same or larger than a width of the slot defined by a distance between the first and second surfaces of the slot.

4. The heat transfer assembly according to claim 2, wherein the at least one protrusion comprises a plurality of protrusions uniformly spaced along the first surface of the edge portion.

5. The heat transfer assembly according to claim 1, wherein the slot has a rectangular cross-section.

6. The heat transfer assembly according to claim 1, wherein the first member comprises a plurality of slots in the surface thereof, and a plurality of second members have edge portions received in the plurality of slots.

7. The heat transfer assembly according to claim 6, wherein the plurality of slots have rectangular cross-sections of approximately identical size.

8. The heat transfer assembly according to claim 6, wherein the plurality of slots are arranged in parallel on the surface of the first member.

9. The heat transfer assembly according to claim 6, wherein the plurality of second members are arranged in parallel on the first member.

10. The heat transfer assembly according to claim 1, wherein except for the offsetting means the first and second surfaces of the second member are substantially planar.

11. The heat transfer assembly according to claim 1, wherein the first member is a portion of a device chosen from the group consisting of circuit component, heat exchangers, electric motors, and electric generators, and the second member is a heat-dissipating fin of the device.

12. A heat transfer assembly method comprising the steps of:
    forming a first member to have a slot in a surface thereof, the slot having opposing first and second surfaces;
    forming a second member to have an edge portion with opposing first and second surfaces;
    dispensing an adhesive in the slot of the first member; and
    inserting the edge portion of the second member into the slot of the first member so that the first and second surfaces of the edge portion face the first and second surfaces, respectively, of the slot, wherein insertion of the edge portion into the slot forces the edge portion into an offset position within the slot so that the first surface of the edge portion is forced away from the first surface of the slot to define a gap therebetween in which the adhesive is present to bond the first surfaces of the edge portion and the slot, the adhesive is displaced from between the second surfaces of the edge portion and the slot, and the second surface of the edge portion is forced into substantially surface-to-surface contact with the second surface of the slot.

13. The heat transfer assembly method according to claim 12, wherein at least one protrusion on the edge portion of the second member and protruding from the first surface thereof forces the edge portion into the offset position within the slot, forces the first surface of the edge portion away from the first surface of the slot and forces the second surface of the edge portion into substantially surface-to-surface contact with the second surface of the slot during the inserting step.

14. The heat transfer assembly method according to claim 13, wherein the edge portion has a composite thickness defined by a distance between the second surface of the edge portion and an outermost extent of the at least one protrusion from the first surface of the edge portion, and the composite thickness is the same or larger than a width of the slot defined by a distance between the first and second surfaces of the slot.

15. The heat transfer assembly method according to claim 13, wherein the at least one protrusion comprises a plurality of protrusions formed to be uniformly spaced along the first surface of the edge portion.

16. The heat transfer assembly method according to claim 12, wherein the first member comprises a plurality of slots in the surface thereof, the method further comprising the step of inserting edge portions of a plurality of second members into the plurality of slots.

17. The heat transfer assembly method according to claim 16, wherein the plurality of slots are formed to have rectangular cross-sections of approximately identical size.

18. The heat transfer assembly method according to claim 16, wherein the plurality of slots are formed to be arranged in parallel on the surface of the first member.

19. The heat transfer assembly method according to claim 16, wherein the inserting step causes the plurality of second members to be arranged in parallel on the first member.

20. The heat transfer assembly method according to claim 12, wherein the second member is a fin and dissipates heat from the first member.

* * * * *